(12) United States Patent
Feyh et al.

(10) Patent No.: US 9,400,288 B2
(45) Date of Patent: Jul. 26, 2016

(54) PACKAGING SYSTEM AND PROCESS FOR INERTIAL SENSOR MODULES USING MOVING-GATE TRANSDUCERS

(71) Applicant: Robert Bosch GmbH, Stuttgart (DE)

(72) Inventors: Ando Feyh, Palo Alto, CA (US); Po-Jui Chen, Cupertino, CA (US)

(73) Assignee: Robert Bosch GmbH, Stuttgart (DE)

( * ) Notice: Subject to any disclaimer, the term of this patent is extended or adjusted under 35 U.S.C. 154(b) by 428 days.

(21) Appl. No.: 14/094,450

(22) Filed: Dec. 2, 2013

(65) Prior Publication Data

US 2014/0150553 A1 Jun. 5, 2014

Related U.S. Application Data

(60) Provisional application No. 61/733,544, filed on Dec. 5, 2012.

(51) Int. Cl.
| | |
|---|---|
| *G01P 15/08* | (2006.01) |
| *G01P 15/105* | (2006.01) |
| *G01P 15/12* | (2006.01) |
| *G01P 15/18* | (2013.01) |
| *B81B 7/02* | (2006.01) |
| *G01C 19/5783* | (2012.01) |

(52) U.S. Cl.
CPC . *G01P 15/08* (2013.01); *B81B 7/02* (2013.01); *G01C 19/5783* (2013.01); *G01P 15/0802* (2013.01); *G01P 15/105* (2013.01); *G01P 15/124* (2013.01); *G01P 15/18* (2013.01); *B81B 2201/0235* (2013.01); *B81B 2207/015* (2013.01); *G01P 2015/0865* (2013.01)

(58) Field of Classification Search
CPC ............ H01L 29/6659; H01L 29/7833; H01L 29/665; H01L 29/6656; G01P 15/08; G01P 15/11; G01P 15/18; G01P 15/105
USPC .............. 438/51; 257/288; 73/514.31, 514.16
See application file for complete search history.

(56) References Cited

U.S. PATENT DOCUMENTS

| | | | |
|---|---|---|---|
| 5,576,251 A | 11/1996 | Garabedian et al. | |
| 8,183,078 B2 | 5/2012 | Ollier et al. | |
| 2009/0282917 A1 | 11/2009 | Acar | |
| 2010/0122565 A1* | 5/2010 | Miller ..................... | G01P 21/00 73/1.37 |
| 2010/0186511 A1 | 7/2010 | Kautzsch et al. | |
| 2011/0057236 A1 | 3/2011 | Feyh | |
| 2012/0032283 A1 | 2/2012 | Frey et al. | |

(Continued)

OTHER PUBLICATIONS

International Search Report and Written Opinion corresponding to PCT Application No. PCT/US2013/072695, mailed Apr. 10, 2014 (12 pages).

(Continued)

*Primary Examiner* — Monica D Harrison
(74) *Attorney, Agent, or Firm* — Maginot Moore & Beck LLP

(57) ABSTRACT

A sensor device includes a first CMOS chip and a second CMOS chip with a first moving-gate transducer formed in the first CMOS chip for implementing a first 3-axis inertial sensor and a second moving-gate transducer formed in the second CMOS chip for implementing a second 3-axis inertial sensor. An ASIC for evaluating the outputs of the first 3-axis inertial sensor and the second 3-axis inertial sensor is distributed between the first CMOS chip and the second CMOS chip.

26 Claims, 4 Drawing Sheets

(56) References Cited

U.S. PATENT DOCUMENTS

2012/0068276 A1* 3/2012 Lin .................... B81C 1/00571
  257/415
2012/0255357 A1 10/2012 Chen et al.

OTHER PUBLICATIONS

LSM333D datasheet, "iNEMO Intertial Module: 9 degrees of freedom sensing solution." Mar. 2012.

* cited by examiner

US 9,400,288 B2

PACKAGING SYSTEM AND PROCESS FOR INERTIAL SENSOR MODULES USING MOVING-GATE TRANSDUCERS

CROSS-REFERENCE

This application claims priority under 35 U.S.C. §119 to U.S. provisional application No. 61/733,544, filed on Dec. 5, 2012, the disclosure of which is incorporated herein by reference in its entirety.

TECHNICAL FIELD

This disclosure relates generally to sensors, and in particular to systems and methods of packaging sensors, such as inertial, pressure, uFon, and the like.

BACKGROUND

Inertial sensors are sensors configured to measure various types of movement, such as acceleration, tilt, shock, vibration, rotation, and multiple degrees-of-freedom (DoF) motion. Inertial sensing has found use in a wide variety of fields and applications and have been incorporated into many devices, including smartphones, tablets, gaming systems, automotive, and power tool. Inertial sensors are typically implemented by multiple sensor devices that are each configured to measure a movement related parameter along multiple axes, e.g., 3-axis accelerometers, 3-axis gyroscopes, and/or 3-axis magnetic field sensors. The output of these devices can be combined to quantify different types of movement.

One difficulty faced in inertial sensor technology is finding ways to package inertial sensors that enables multiple DoF systems (e.g., 6DoF and 9DoF) to be realized in packaging sizes that can be incorporated into handheld or portable devices with small housing/enclosure or housing with limited space, such as smartphones, tablet, diagnostic tools, scan-tools, and portable corded/cordless power tools. For example, inertial sensors are typically implemented as MEMS sensors utilizing capacitive detection techniques. Capacitive MEMS sensors, however, are generally not capable of being efficiently integrated into complementary metal-oxide semiconductor (CMOS) processing and have a rather large footprint, e.g., 2.5×2.5 mm$^2$. Packaging methods, such as chip-stacking and hybrid integration, are commonly used to package capacitive MEMS sensors which result in package sizes that are approximately 3×3 mm$^2$ or larger.

Footprint sizes of less than 2.5×2.5 mm$^2$, e.g. 1× 1 mm$^2$ . . . 2×2 mm$^2$, with a height of less than 1 mm (target: below 0.5 mm) are typically required for incorporation into mass-market handheld or portable devices. However, these two requirements can hardly be met with conventional technology. For example, the current smallest package sizes of 6DoF inertial sensor systems (e.g., 3-axis accelerometer and 3-axis gyroscope) is 4×4 mm$^2$ footprint with 0.9 mm height. A footprint of 2×2 mm$^2$ for 6DoF systems is not feasible with current technological approaches. Stacking of single chips allows theoretically a small footprint of 2.5×2.5 mm$^2$, however, this is only possible by increasing the height of the sensor footprint above 1 mm.

DRAWINGS

Figure 5:
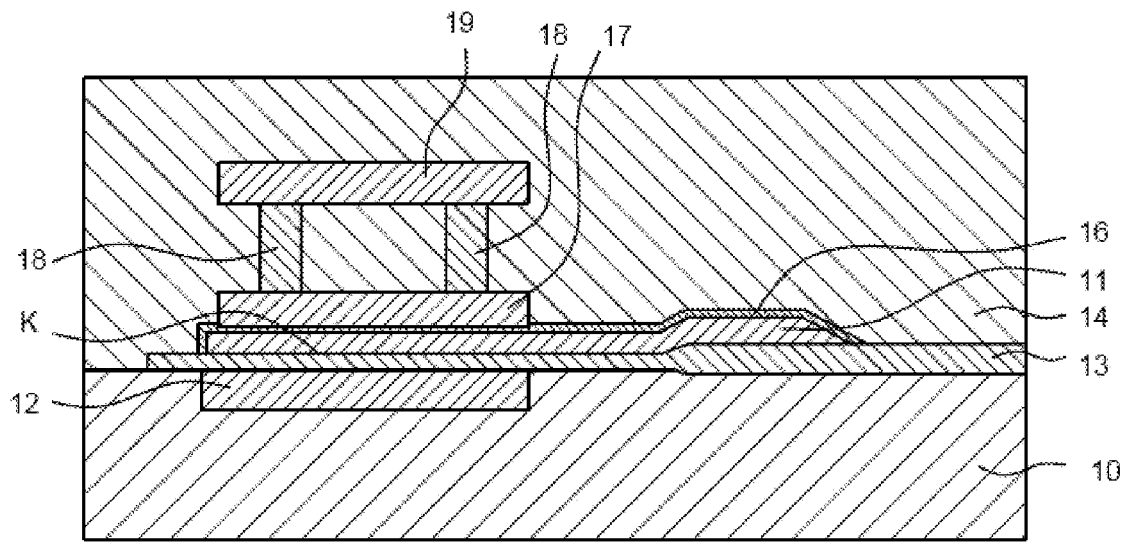
Figure 6:
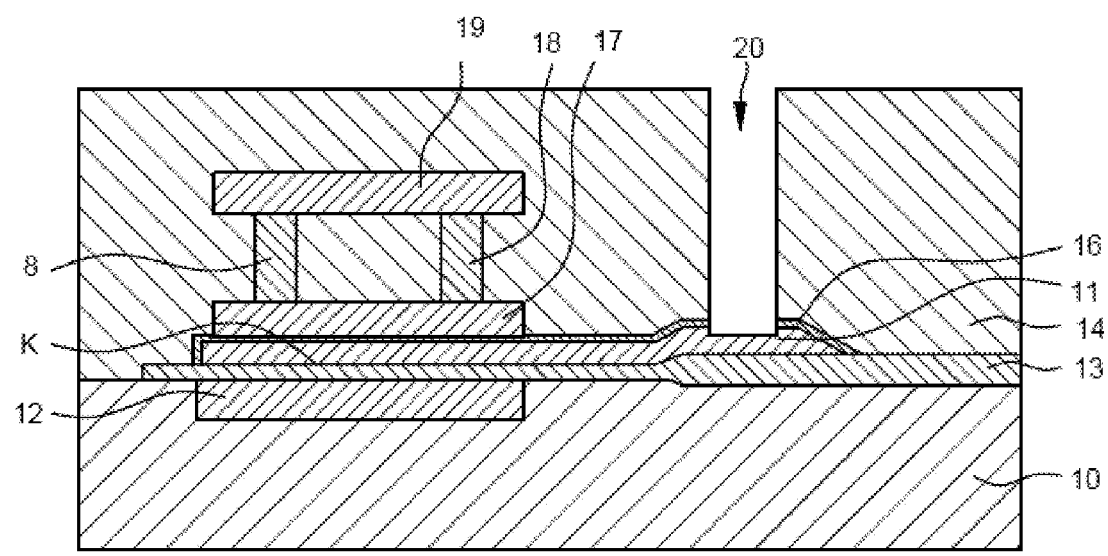
Figure 7:
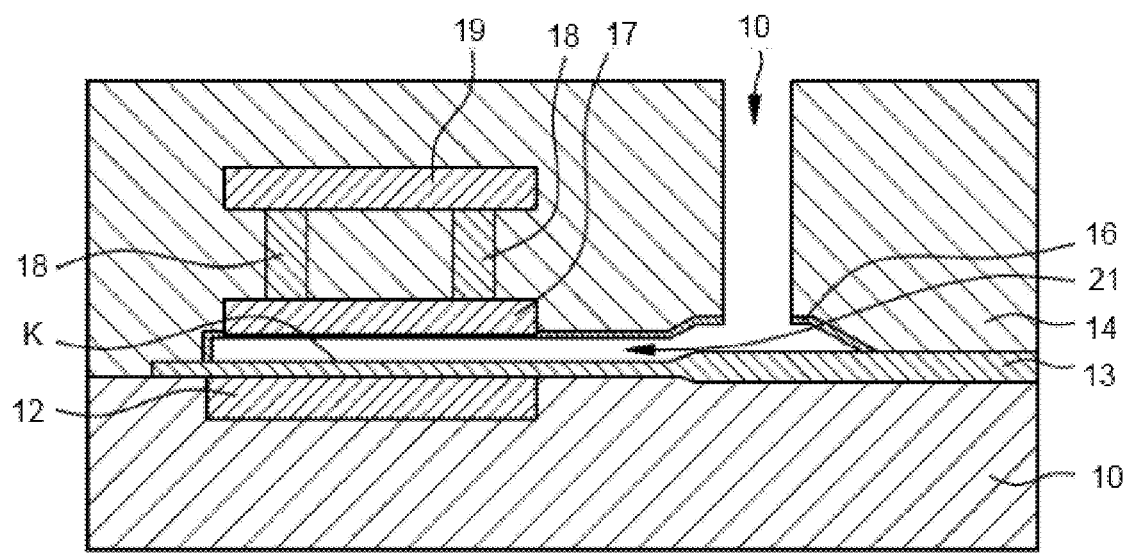

FIGS. 5-7 schematically depict a process for fabricating a moving gate electrode for an inertial sensor.

DESCRIPTION

For the purposes of promoting an understanding of the principles of the disclosure, reference will now be made to the embodiments illustrated in the drawings and described in the following written specification. It is understood that no limitation to the scope of the disclosure is thereby intended. It is further understood that this disclosure includes any alterations and modifications to the illustrated embodiments and includes further applications of the principles of the disclosure as would normally occur to one of ordinary skill in the art to which this disclosure pertains.

This disclosure is directed to packages and methods of packaging 6DoF and 9DoF inertial sensors that enable package sizes of and below a footprint of 2×2 mm$^2$ and heights of and below 0.6 mm. The method involves the implementation of a CMOS integrated moving-gate transducer in conjunction with a system partitioning approach enabled by the complete CMOS integration of all implemented sensor types. Moving-gate is used for the inertial sensors and preferably a Hall effect sensor is used for the magnetic sensor (this magnetometer can however also be realized using different transduction principles). The methods disclosed herein enable the production of small size, cost-efficient and highly sensitive MEMS sensors. The methods also enable highly integrated sensor modules, 6 degree-of-freedom, and 9 degree-of-freedom sensors, as well as the integration of sensors in CMOS-technology. The sensors and sensor modules that can be produced using these methods can be used in substantially any device from smartphones to vehicles and household appliances.

In one embodiment, a sensor device is provided that includes a first complementary metal-oxide semiconductor (CMOS) chip having a first mounting side and including first bonding structures and first chip-to-chip electrical contacts on the first mounting side. The sensor device also includes a second CMOS chip having a second mounting side arranged facing the first mounting side and including second bonding structures and second chip-to-chip electrical contacts on the second facing side. The second bonding structures are bonded to the first bonding structures and the second chip-to-chip contacts are electrically connected to the first chip-to-chip contacts to form a package. A first moving-gate transducer is formed in the first CMOS chip for implementing a first 3-axis inertial sensor. A second moving-gate transducer is formed in the second CMOS chip for implementing a second 3-axis inertial sensor. A sensor application-specific integrated circuit (ASIC) is operably coupled to receive and evaluate outputs of the first 3-axis inertial sensor and the second 3-axis inertial sensor. The sensor ASIC includes a first ASIC portion formed in the first CMOS chip and a second ASIC portion formed in the second CMOS chip. The first and the second ASIC portions are coupled via the first and the second chip-to-chip contacts.

In another embodiment, a method of fabricating an inertial sensor module is provided. The method includes fabricating a first CMOS chip having first bonding structures and first chip-to-chip contacts and including a first moving-gate transducer for implementing a first 3-axis inertial sensor. A second CMOS chip is fabricated having second bonding structures and second chip-to-chip electrical contacts and including a second moving-gate transducer for implementing a second 3-axis inertial sensor. A first ASIC portion is formed in the first CMOS chip, and a second ASIC portion is formed in the second CMOS chip for implementing a device ASIC for evaluating outputs of at least one of the first 3-axis inertial sensor and the second 3-axis inertial sensor.

The sensor ASIC may include a first inertial sensor ASIC for evaluating output of the first 3-axis inertial sensor and a second 3-axis inertial sensor ASIC for evaluating output of the second inertial sensor. The sensor ASIC may also include a combined sensor ASIC for evaluating the output of the first 3-axis inertial sensor and the second 3-axis inertial sensor with respect to each other. The first 3-axis inertial sensor and the second 3-axis inertial sensor may each comprise one of a 3-axis MEMS accelerometer and a 3-axis MEMS gyroscope. In one embodiment, a third 3-axis inertial sensor is formed in either the first CMOS chip or the second CMOS chip, and a third inertial sensor ASIC is provided for evaluating output of the third 3-axis inertial sensor. The third 3-axis inertial sensor may comprise a magnetic field sensor and may be implemented using 3-axis Hall effect sensor. The configuration of the sensor enables the CMOS chips to be bonded together to form a package having a footprint size that is 2 mm by 2 mm or less and a height of 0.8 mm or less.

In another embodiment, a method of fabricating an inertial sensor module is provided. The method includes fabricating a first CMOS chip having first bonding structures and first chip-to-chip contacts and including a first moving-gate transducer for implementing a first 3-axis inertial sensor. A second CMOS chip is fabricated having second bonding structures and second chip-to-chip electrical contacts and including a second moving-gate transducer for implementing a second 3-axis inertial sensor. A first ASIC portion is formed in the first CMOS chip, and a second ASIC portion is formed in the second CMOS chip for implementing a device ASIC for evaluating outputs of at least one of the first 3-axis inertial sensor and the second 3-axis inertial sensor.

According to the disclosure, two CMOS chips A,B are bonded together, facing each other. As the sensors are completely integrated in the CMOS, the sensors and ASIC functionality are to be distributed over both CMOS chips. This is economically enabled by the high sensitivity of the moving-gate transducer, as this allows for extremely small sensor sizes. A 3-axis accelerometer implemented using moving gate transducers can be provided with a footprint at or below 0.1 mm$^2$. A 3-axis gyroscope implemented using moving gate transducers can be provided with a footprint at or below 0.3 mm$^2$ (3 axis, 0.1 mm$^2$ each). This is about a factor of ten to twenty times (i.e, ×10 ... ×20) below the size of a corresponding conventional capacitive sensor element.

Inertial sensors typically include an application-specific integrated circuit (ASIC) for processing the outputs of the sensor devices to produce a movement measurement. The size of the ASIC is typically the same or even larger as compared to size of the MEMS element for conventional capacitive transducer sensors and it will remain in 1st order approximation the same for moving-gate transducer sensors. To enable an ASIC to be incorporated into the inertial sensor of the disclosure, the ASIC is partitioned and distributed between both chips of the sensor. For 9DoF, the ASIC size is about 7 mm$^2$ which results in a footprint size no smaller than 3×3 mm$^2$. By partitioning the ASIC, this barrier is lifted, allowing a 2×2 mm$^2$ footprint and below which would not be possible otherwise. As the overall ASIC size remains the same, no additional cost is required. The cost is even reduced, as a standard cap wafer for sensor encapsulation is not required.

The sensor device structures can be implemented on one chip or can also be distributed between both chips. For example, in a 9DoF system (3-axis accelerometer, 3-axis gyroscope, and 3-axis magnetic field sensor), the 3-axis accelerometer and 3-axis magnetic field sensor (e.g., 3D Hall) can be implemented in chip A and the 3-axis gyroscope can be implemented in chip B. By distributing the sensor structures between chips, the overall system area can be further reduced. It is also possible to have all sensors in e.g. Chip A, including analog frontend for signal conditioning of the sensors. The Chip B is then mostly digital. This also allows the use of 2 different ASIC nodes for Chip A and Chip B (e.g. 0.35 um for Chip A with sensor structures and analog, 0.18 um for Chip B width mostly digital and through silicon vias.).

As another example, the 3-axis accelerometer and the 3-axis gyroscope may be implemented on the same CMOS chip while the ASIC is divided based on functionality between the first and second CMOS chips. For example, the analog frontend of the ASIC for signal evaluation may be implemented on the same CMOS chip as the 3-axis accelerometer and the 3-axis gyroscope while the digital backend of the ASIC is implemented on the second CMOS chip. By incorporating the MEMS devices onto the same chip, the MEMS structures can be consolidated. For instance, the 3-axis accelerometer and the 3-axis gyroscope each have a cavity associated with the moving-gate transducer. The cavity is sealed and provided with a pressure that is selected based in part on the desired performance of the sensor. By incorporating both the accelerometer and the gyroscope on the same CMOS chip, it is possible for both devices to utilize the same cavity which can save space on the chip and allow reduction in size although the sensors will have to be configured to use the same pressure. Of course, separate cavities with separate pressures may also be used for the accelerometer and the gyroscope.

By utilizing moving gate transducers for the accelerometer and gyroscope sensor structures and Hall effect sensors for the magnetic field sensors and by distributing the ASIC and possibly the sensor elements between multiple chips, the system size and cost are minimized. Both CMOS-chips serve as hermetic capping for the included MEMS elements. No area is wasted by being non-functional, and perfect size matching is obtained. This allows for a system size of 2×2 mm$^2$ and below regarding the foot-print, and a height of 0.6 mm and below. Disruptive package size is enabled that is not feasible with existing technologies.

The above methodology is also extendable to pure 3-axis accelerometers or 3-axis gyroscopes. The foot-print can be cut in half using the proposed approach. As the total ASIC area is constant, the cost is also reduced, as no separate cap wafer is needed. In addition, the overall ASIC cost is further reduced by splitting it into two dies. For 6/9 DoF elements and a bare-die package, high-voltage option (HV) in the CMOS (gyroscope operation) and through-silicon-vias (TSV) are required. Both yield to significant higher ASIC costs per area. Both options add easily a total of 25% cost to the original CMOS process. If the ASIC is realized within one die, the costs are therefore increased by 25%. If however, the ASIC is distributed over 2 dies and partitioning is made in optimal way, only the half of the ASIC area (1 die) needs HV and TSV option. Therefore the total ASIC costs are increased only by about 12%.

As the system ASIC is to be distributed over both CMOS chips, IC-testing may be challenging. One option that may implemented to allow testing of the CMOS chips is to make each of the CMOS chips individually testable. This requires that the partitioning of the chips be done in a manner to allow testing of the individual integrated circuit blocks.

Another option to allow testing of the CMOS chips is to fabricate the CMOS chips side-by-side within the same CMOS wafer. The overall setup results in an alternating, checkerboard pattern (e.g., A, B, A, B . . . ). During testing, two chips A,B are connected to each other using probes. By this method, the whole system can be tested during processing. Later, two identical wafers are bonded against each other and according to the wafer-design, the two chips A,B are facing each other.

In some cases it may be beneficial to use no testing at all during the processing and only test the completed system. In these cases, the challenge of testing is also solved. The realization of the two chips within one wafer is also beneficial in that only one CMOS design and maskset need to be done which is highly cost-efficient.

Figure 1:
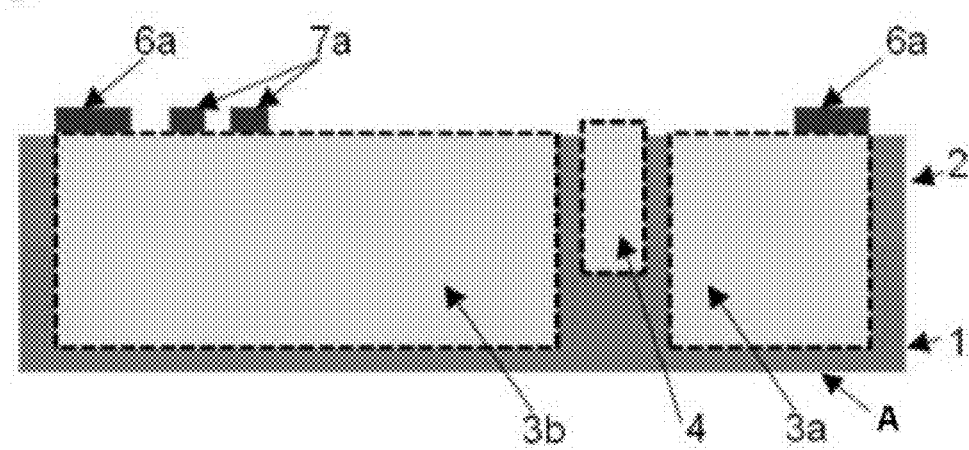
FIG. 1 shows a CMOS chip A configured to bond with a CMOS chip B (FIG. 2) in accordance with the disclosure to form a 9DoF sensor.
Figure 2:
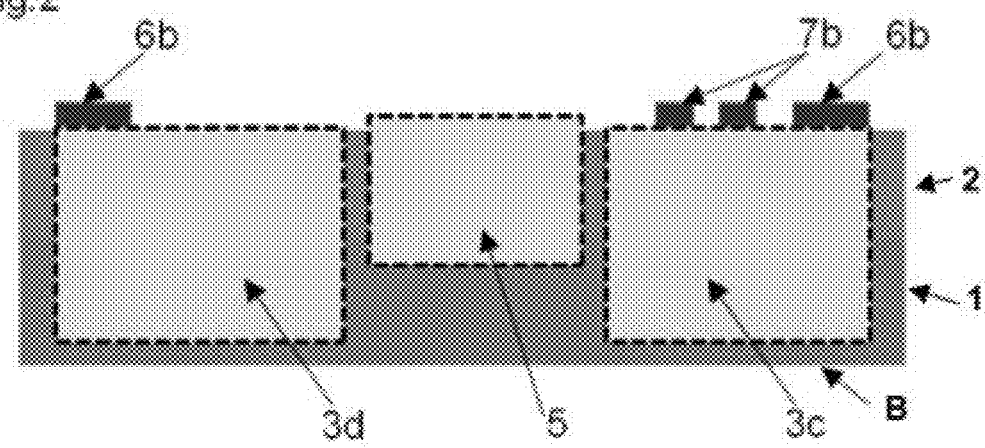
FIG. 2 shows CMOS chip B configured to bond with CMOS chip A of FIG. 1 to form a 9DoF sensor.
Figure 3:
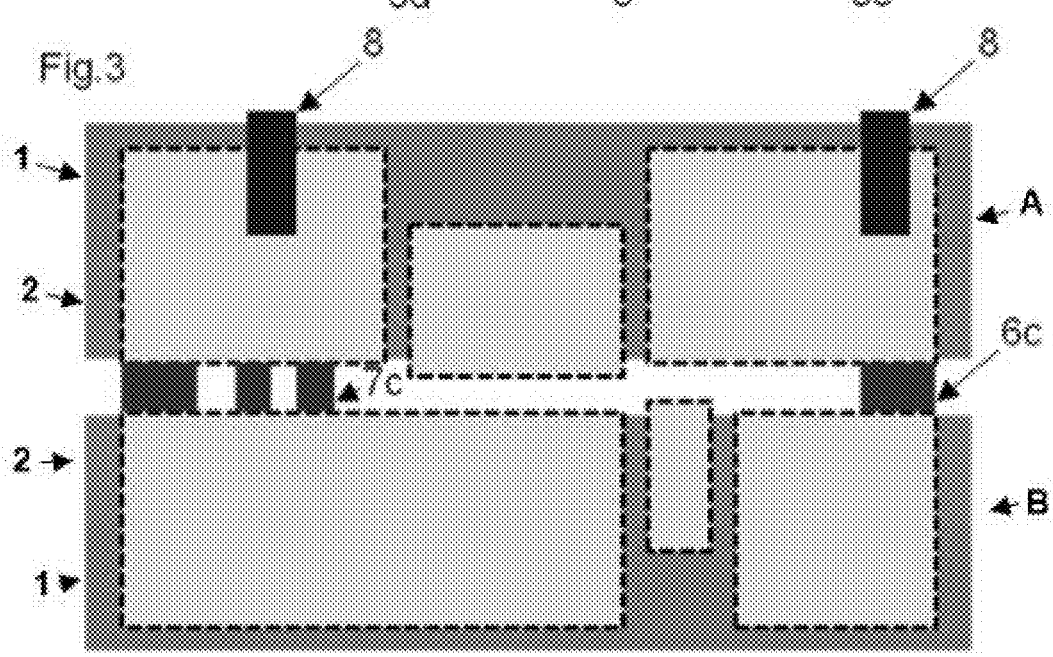
FIG. 3 depicts the bonded stack of chip A (FIG. 1) and chip B (FIG. 2).

FIGS. 1-4 schematically depict the configurations of two CMOS chips A, B configured to implement a 9DoF sensor. More than two CMOS chips may be configured in a sensor. For example, the configuration can be a single chip A and a dual chips B mounted above or below chip A, a dual chips A and a single chip B mounted above or below on one of both the chip A, two pairs of chips A and B mounted or attached side by side, above or below other as stacked or tandem, more combination thereof. Or a configuration similar as shown in FIG. 3 but including an additional chip C stacked ontop of chip A inbetween the TSV area. FIG. 1 depicts chip A prior to being bonded to chip B while FIG. 2 depicts chip B prior to being bonded to chip A. FIG. 3 depicts the bonded stack of chip A and chip B. Referring to FIG. 1, chip A includes a substrate 1, such as a silicon wafer or silicon-on-insulator (SOD, having a CMOS layer stack (e.g, oxide/metal stack) 2. The ASIC 3 for the sensor is partitioned into blocks 3*a*, 3*b*, 3*c*, 3*d* and distributed between chip A and chip B with blocks 3*a* and 3*b* being allocated to chip A and blocks 3*c* and 3*d* being allocated to chip B. A (3-axis) accelerometer 4 is implemented in chip A by a moving-gate transducer. Although one 3-axis moving component is illustrated, more than one moving component can be implemented in chip A. Chip A is also provided with bonding structures 6*a*, such as a hermetic bond frame, and chip-to-chip electrical contacts 7*a*. Other bonding structures 6*a* not defined herein are also possible to bond chips A and B together.

As depicted in FIG. 2, chip B includes a substrate 1 having a CMOS layer stack (e.g, oxide/metal stack) 2. Chip B also includes ASIC blocks 3*c*, 3*d* as well as a (3-axis) gyroscope 5 implemented by a moving-gate transducer. Although one 3-axis moving component is illustrated, more than one moving component can be implemented in chip A. Chip B includes bonding structures 6*b*, such as a hermetic bond frame, and chip-to-chip electrical contacts 7*b* that are configured to cooperate with the bonding structures 6*a* and chip-to-chip contacts 7*a* of chip A in bonding chip A and chip B together. The partitioning of the sensor components between chip A and chip B in FIGS. 1-3 is one example of how the components can be distributed between chips. The partitioning of course can be done in many other ways. For example, all of the MEMS elements could be incorporated into one chip, e.g., chip A.

FIGS. 5-7 depict an exemplary process for fabricating a moving-gate transducer for an inertial sensor. Referring to FIG. 5, a silicon substrate 10 includes a field effect transistor 12 which has a channel region K. A thermal oxide layer 13 (e.g., gate oxide or local oxidation of silicon (LOCOS)) covers at least a portion of the surface of the substrate 10. A CMOS process stack is formed on the thermal oxide layer 13 that comprises a first polysilicon layer 11, a thermal oxide layer 16, a second polysilicon layer 17, a metal layer 19, and an insulating layer 14. The first polysilicon layer 11 is configured to serve as a sacrificial layer. The second polysilicon layer 17 is configured to be shaped to form a movable gate electrode. Intermetal vias 18 are provided to electrically connect the polysilicon layer 17 to the metal layer 19.

Referring to FIG. 6, an etching process, for example an anisotropic oxide etchant, is performed to form an access hole 20 that extends through the insulating layer 14 and thermal oxide layer 16 to provide access to the first polysilicon layer 11. The access hole 20 is laterally offset from the field effect transistor 12 to allow the movable gate to be made from the second polysilicon layer 17.

The sacrificial polysilicon layer 11 is etched by introducing an etchant, such as SF6, ClF3 or XeF2, through the access hole 20. The gate oxide 13 and the thermal oxide layer 16 are not harmed by this sacrificial layer etching process. The field effect transistor 12 is thus completely unaffected and intact. A plasma etching process, for example, may be utilized to avoid a charging of the electrodes 17, 19. As depicted in FIG. 7, the removal of the sacrificial layer 11 results in a cavity 21 being formed beneath the gate electrode 17 which releases the electrode 17 to form a moving gate without disturbing the transistor properties of the electrode 17. For a more detailed description of the moving gate process in CMOS integration with silicon sacrificial layers, please refer to PCT/EP2012/065942 filed Aug. 15, 2012 (to the same applicant as the present disclosure), the entire disclosure of which is hereby incorporated herein by reference in its entirety.

Returning now to FIGS. 1-3, the (3 axis) magnetic field sensor is not depicted but is preferably realized using 3D Hall sensors. Alternatively, AMR, GMR, or Flipcore type sensors may be used. Partitioning allows the magnetic field sensor to be realized within chip A or B, e.g., within area 3*b* if CMOS-hall sensor is used. The overall ASIC for evaluation of the nine sensor axes and motion processing is fully distributed within areas 3*a*, 3*b*, 3*c*, 3*d*.

FIG. 3 shows the bonded stack of chip A and chip B. Bonding can be done using, e.g., eutectic, thermo-compression or SLID (solid-liquid-interdiffusion) bonding. The hermetic bond frames 6*a* and 6*b* are bonded together forming hermetic bond frame 6*c*. Chip-to-chip contacts 7*a* and 7*b* of chips A and B are bonded together to form chip-to-chip connections 7*c*. The hermetic seal frame can also be realized directly around the inertial sensor elements 4, 5.

Bonding is preferably done over active IC area in order to minimize the footprint. Both inertial sensors share may have the same pressure regime, e.g., using a common sensor cavity or different cavities with the same pressure. It is also possible to use different pressure regimes for both the accelerometer and gyroscope. By using separate bondwings for accelerometer and gyroscope, two different operation pressures can also be achieved, when implementing a getter. This getter is preferably deposited on the ASIC die facing the gyroscope element within the gyroscope bond-frame which enables the operation pressure to be considerably reduced.

As depicted in FIG. 3, terminal structures 8, such as through-silicon-vias (TSVs), may be realized after wafer-bonding, or by the ASIC vendor / during the ASIC processing before the wafer-bonding. TSVs are required for making the I/O ports accessible. The completed element, then can be, for example, bare-die mounted using solder balls or embedded within a LGA mold-package (not shown). After bonding, the individual wafers can be back-grinded for lower system-height. Chip A serves as cap for sensor element 5 and chip B serves as cap for sensor element 4 in the device of FIG. 3.

Figure 4:
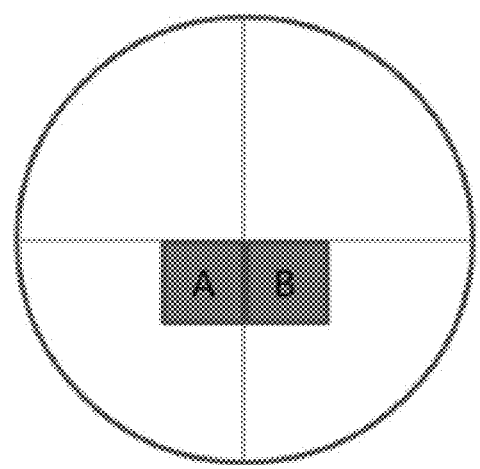
FIG. 4 shows the realization of both chips A, B within one CMOS-wafer.

FIG. 4 shows the realization of both chips A, B within one CMOS-wafer. Two identical wafers are then bonded against each other. Utilizing the correct symmetry, each A chip is bonded against a corresponding B chip. Bonding on chip-to-wafer level is also possible. As another alternative, an implementation using two different CMOS wafers, one comprising only chip A, the other comprising only chip B, is also possible.

Although the proposed method has been described in conjunction with 6DoF and 9DoF elements, it may also be beneficial for pure accelerometers and pure gyroscopes for reducing the element size and cost. The overall idea is described using a moving-gate transducer for the inertial sensors as by this the sensor size can be reduced by 10× . . . 20×, compared to the commonly used capacitive transduction principle.

If it becomes possible to reduce the size of MEMS devices, e.g., by approximately 10 times, the proposed approach of ASIC splitting into two dies can be applied in these cases as well. For example, it may be possible to have a system comprising a first ASIC die, a silicon layer, and a second ASIC die. The capacitive MEMS elements would be realized within the silicon layer (e.g., approximately 10-100 micron thickness), the encapsulation and mechanical anchoring of the sensor structure would be done by ASIC dies.

While the disclosure has been illustrated and described in detail in the drawings and foregoing description, the same should be considered as illustrative and not restrictive in character. It is understood that only the preferred embodiments have been presented and that all changes, modifications and further applications that come within the spirit of the disclosure are desired to be protected.

What is claimed is:

1. A sensor device comprising:
   a first complementary metal-oxide semiconductor (CMOS) chip having a first mounting side and including first bonding structures and first chip-to-chip electrical contacts on the first mounting side;
   a second CMOS chip having a second mounting side arranged facing the first mounting side and including second bonding structures and second chip-to-chip electrical contacts on the second facing side, the second bonding structures being bonded to the first bonding structures and the second chip-to-chip contacts being electrically connected to the first chip-to-chip contacts;
   a first moving-gate transducer formed in the first CMOS chip, the first moving-gate transducer implementing a first 3-axis inertial sensor;
   a second moving-gate transducer formed in the second CMOS chip, the second moving-gate transducer implementing a second 3-axis inertial sensor;
   a sensor application-specific integrated circuit (ASIC) operably coupled to receive and evaluate outputs of the first 3-axis inertial sensor and the second 3-axis inertial sensor, the sensor ASIC including a first ASIC portion formed in the first CMOS chip and a second ASIC portion formed in the second CMOS chip, the first and the second ASIC portions being coupled via the first and the second chip-to-chip contacts.

2. The device of claim 1, wherein the sensor ASIC includes a first inertial sensor ASIC for evaluating output of the first 3-axis inertial sensor, a second 3-axis inertial sensor ASIC for evaluating output of the second inertial sensor, and a combined sensor ASIC for evaluating the output of the first 3-axis inertial sensor and the second 3-axis inertial sensor with respect to each other.

3. The device of claim 2, wherein the first 3-axis inertial sensor and the second 3-axis inertial sensor each comprise one of a 3-axis MEMS accelerometer and a 3-axis MEMS gyroscope.

4. The device of claim 3, further comprising:
   a third 3-axis inertial sensor formed in either the first CMOS chip or the second CMOS chip, and
   wherein the sensor ASIC includes a third inertial sensor ASIC for evaluating output of the third 3-axis inertial sensor.

5. The device of claim 4, wherein the third 3-axis inertial sensor comprises a magnetic field sensor.

6. The device of claim 5, wherein the magnetic field sensor is implemented using 3-axis Hall effect sensor.

7. The device of claim 6, wherein the first CMOS chip and the second CMOS chip are bonded together to form a package having a footprint size that is 2 mm by 2 mm or less.

8. The device of claim 7, wherein the package has a height of 0.8 mm or less.

9. A method of fabricating an inertial sensor module, the method comprising:
   fabricating a first CMOS chip with first bonding structures and first chip-to-chip contacts and at least one ASIC block;
   fabricating a second CMOS chip second bonding structures and second chip-to-chip electrical contacts and at least one ASIC block;
   forming a first moving-gate transducer in one of the first CMOS chip and the second CMOS chip, the first moving-gate transducer being configured to implement a first 3-axis inertial sensor;
   forming a second moving-gate transducer in one of the first CMOS chip and the second CMOS chip, the second moving-gate transducer being configured to implement a second 3-axis inertial sensor; and
   wherein an ASIC for evaluating signals produced by the first and the second 3-axis inertial sensors is distributed between the at least one ASIC block of the first CMOS chip and the at least one ASIC block of the second CMOS chip.

10. The method of claim 9, further comprising:
    forming a first inertial sensor ASIC in at least one of the at least one ASIC block of the first CMOS chip and the at least one ASIC block of the second CMOS chip, the first inertial sensor ASIC for evaluating output of the first 3-axis inertial sensor;
    forming a second inertial sensor ASIC in at least one of the at least one ASIC block of the first CMOS chip and the at least one ASIC block of the second CMOS chip, the second inertial sensor ASIC for evaluating output of the second 3-axis inertial; and
    forming an overall sensor ASIC in at least one of the at least one ASIC block of the first CMOS chip and the at least one ASIC block of the second CMOS chip for evaluating outputs of the first 3-axis inertial sensor and the second 3-axis inertial sensor with respect to each other.

11. The method of claim 9, wherein the first 3-axis inertial sensor and the second 3-axis inertial sensor each comprise one of a 3-axis MEMS accelerometer and a 3-axis MEMS gyroscope.

12. The method of claim 9, further comprising:
    forming a third 3-axis inertial sensor in one of the first CMOS chip and the second CMOS chip; and forming a third inertial sensor ASIC in one of the first ASIC portion and the second ASIC portion for evaluating output of the third 3-axis inertial sensor.

13. The method of claim 12, wherein the third 3-axis inertial sensor comprises a magnetic field sensor.

14. The method of claim 13, wherein the magnetic field sensor is implemented using 3-axis Hall effect sensor.

15. The method of claim 14, further comprising:
bonding the first CMOS chip and the second CMOS chip together to form a package.

16. The method of claim 15, wherein the bonding structures of the first CMOS chip and the second CMOS chip being bonded together to form a bond frame.

17. The method of claim 16, wherein the first CMOS chip and the second CMOS chip via the chip-to-chip contacts of the first and second CMOS chips.

18. The method of claim 17, wherein the package has a footprint size that is 2 mm by 2 mm or less.

19. The method of claim 17, wherein the package has a height of 0.8 mm or less.

20. The method of claim 17, further comprising:
forming through-silicon-vias that extend through a back side of at least one of the first CMOS chip and the second CMOS chip and include terminals for electrically connecting the first 3-axis inertial sensor, the second 3-axis inertial sensor, the third 3-axis inertial sensor, and the first ASIC, the second ASIC, the third ASIC, and the sensor ASIC to external circuitry.

21. The method of claim 14, further comprising:
forming a third ASIC block in the first CMOS chip and a fourth ASIC block in the second CMOS chip; and
distributing the first, second, and third inertial sensor ASICS and the overall sensor ASIC between the first, second, third, and fourth ASIC blocks of the first and second CMOS chips.

22. The method of claim 14, wherein the first moving-gate transducer is formed in the first CMOS chip and the second moving-gate transducer is formed in the second CMOS chip.

23. The method of claim 14, wherein the first moving-gate transducer, the second moving-gate transducer, and an analog portion (frontend) of the ASIC for signal evaluation are formed in the first CMOS chip, and
wherein a digital portion (backend) of the ASIC for signal evaluation is formed in the second CMOS chip.

24. The method of claim 22, further comprising:
forming a first cavity in the first CMOS chip for the first moving-gate transducer and a second cavity in the first CMOS chip for the second moving-gate transducer, the first cavity having a first pressure and the second cavity having a second pressure.

25. The method of claim 23, further comprising:
forming a single cavity in the first CMOS chip for both the first moving-gate transducer and the second moving-gate transducer.

26. The method of claim 9, wherein at least one of the first moving-gate transducer and the second moving-gate transducer are configured to implement the first 3-axis inertial sensor and the second 3-axis inertial sensor, respectively, using a capacitive transduction principle.

* * * * *